United States Patent
Mitsui

(10) Patent No.: US 9,018,738 B2
(45) Date of Patent: Apr. 28, 2015

(54) SILICON LAYER TRANSFER SUBSTRATE AND METHOD OF MANUFACTURING SEMICONDUCTOR SUBSTRATE

(75) Inventor: Minoru Mitsui, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 301 days.

(21) Appl. No.: 13/365,794

(22) Filed: Feb. 3, 2012

(65) Prior Publication Data

US 2012/0238071 A1 Sep. 20, 2012

(30) Foreign Application Priority Data

Mar. 18, 2011 (JP) .................................... 2011-61609
Jul. 29, 2011 (JP) .................................... 2011-167678

(51) Int. Cl.
| | | |
|---|---|---|
| *H01L 29/06* | (2006.01) | |
| *H01L 21/20* | (2006.01) | |
| *H01L 21/762* | (2006.01) | |
| *H01L 21/02* | (2006.01) | |

(52) U.S. Cl.
CPC ....... *H01L 21/2007* (2013.01); *H01L 21/02381* (2013.01); *H01L 21/76254* (2013.01); *H01L 21/76251* (2013.01); *H01L 21/02376* (2013.01)

(58) Field of Classification Search
CPC .................. H01L 21/76251; H01L 21/76254; H01L 21/02376; H01L 21/02378; H01L 21/02381; H01L 21/2007
USPC .................. 438/455, 464, 356; 257/618, 622, 257/E21.567, E21.568
See application file for complete search history.

(56) References Cited

U.S. PATENT DOCUMENTS

| 7,361,574 B1 * | 4/2008 | Maa et al. ...................... 438/458 |
| 2003/0157783 A1 * | 8/2003 | Fonash et al. ................. 438/458 |
| 2003/0170965 A1 * | 9/2003 | Kondo .......................... 438/455 |
| 2006/0019464 A1 | 1/2006 | Maa et al. |
| 2006/0128117 A1 * | 6/2006 | Ghyselen et al. ............. 438/455 |
| 2007/0023805 A1 * | 2/2007 | Wells et al. ................... 257/295 |
| 2007/0048968 A1 * | 3/2007 | Couillard et al. ............ 438/455 |
| 2008/0296615 A1 * | 12/2008 | Savage et al. ................. 257/190 |
| 2011/0159624 A1 * | 6/2011 | Chen et al. ...................... 438/42 |

FOREIGN PATENT DOCUMENTS

| JP | A-2005-191457 | 7/2005 |
| JP | A-2006-032968 | 2/2006 |
| JP | A-2008-127274 | 6/2008 |

* cited by examiner

*Primary Examiner* — Khiem D Nguyen
(74) *Attorney, Agent, or Firm* — Oliff PLC

(57) ABSTRACT

A silicon layer transfer substrate includes a silicon substrate of a first substrate, a sacrificial layer, and a transfer silicon layer transferred to a second substrate, wherein the sacrificial layer has a silicon compound layer containing a compound of silicon and at least one element selected from a group consisting of germanium and carbon, and is provided on the silicon substrate of the first substrate, the silicon compound layer having a thickness equal to or smaller than a critical film thickness, the transfer silicon layer transferred to the second substrate is provided on the sacrificial layer, and at least either the silicon substrate or the silicon layer has a groove or a hole connected to the sacrificial layer.

17 Claims, 15 Drawing Sheets

SILICON LAYER TRANSFER SUBSTRATE AND METHOD OF MANUFACTURING
SEMICONDUCTOR SUBSTRATE

CROSS-REFERENCE TO RELATED APPLICATIONS

This application is based on and claims priority under 35 USC 119 from Japanese Patent Application No. 2011-61609 filed Mar. 18, 2011 and Japanese Patent Application No. 2011-167678 filed Jul. 29, 2011.

BACKGROUND

1. Technical Field

The invention relates to a silicon layer transfer substrate and a method of manufacturing a semiconductor substrate.

2. Related Art

There is known a method of manufacturing a semiconductor substrate having a silicon layer by transferring the silicon layer formed on a silicon (Si) substrate to another substrate. In this manner, as a method of transferring single-crystal silicon formed on the substrate to another substrate, for example, there is known a method of exfoliating/transferring a SiGe layer as a sacrificial layer from a substrate which has the structure laminated in the order of Si/SiGe/Si.

SUMMARY

According to an aspect of the invention, there is provided a silicon layer transfer substrate including: a silicon substrate of a first substrate; a sacrificial layer; and a transfer silicon layer transferred to a second substrate, wherein the sacrificial layer has a silicon compound layer containing a compound of silicon and at least one element selected from a group consisting of germanium and carbon, and is provided on the silicon substrate of the first substrate, the silicon compound layer having a thickness equal to or smaller than a critical film thickness, the transfer silicon layer transferred to the second substrate is provided on the sacrificial layer, and at least either the silicon substrate or the silicon layer has a groove or a hole connected to the sacrificial layer.

BRIEF DESCRIPTION OF THE DRAWINGS

Exemplary embodiments of the present invention will be described in detail based on the following figures, wherein:

FIGS. 13A to 13C are diagrams illustrating an example of etchant penetration openings provided in a silicon layer transfer substrate in a method of manufacturing a semiconductor substrate according to an exemplary embodiment, in which FIG. 13A is a configuration that an etchant penetration opening reaches the surface of the silicon substrate, FIG. 13B is a configuration that an etchant penetration opening reaches the middle of the silicon substrate, FIG. 13C is a configuration that an etchant penetration opening reaches the middle of the sacrificial layer.

DETAILED DESCRIPTION

Figure 1:
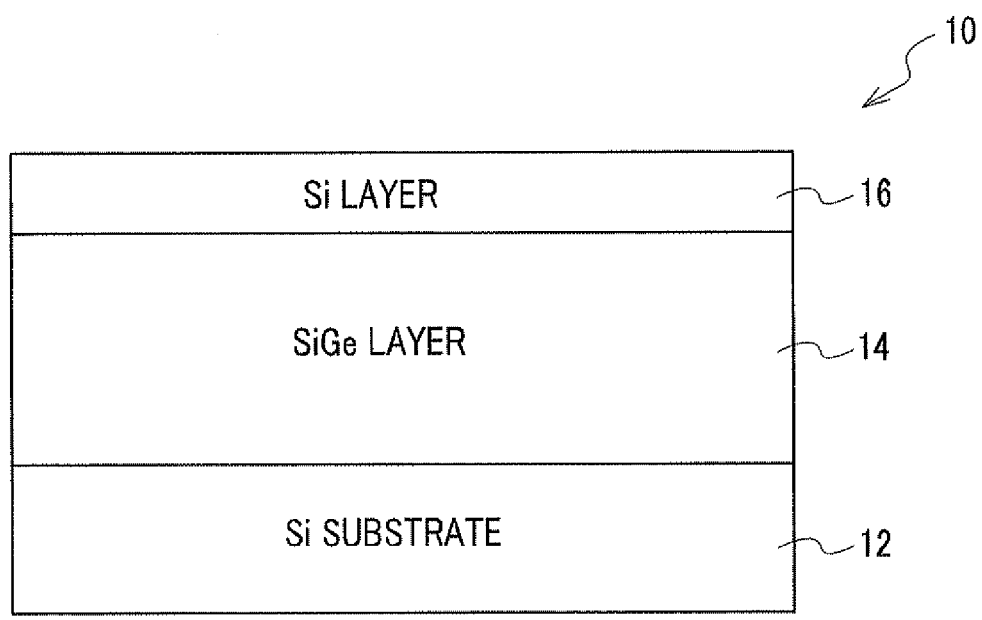
FIG. 1 is a schematic diagram illustrating an example of a configuration of a silicon layer transfer substrate according to an exemplary embodiment.

The exemplary embodiment will be described in detail with reference to the accompanying drawings, in which like reference numerals denote like elements throughout the entire drawings, and description thereof will not be repeated.

If SiGe having different lattice constants is epitaxially grown on the silicon substrate, a strain occurs. As a result, a defect is generated, and the SiGe layer is relaxed. If a Si layer is formed on the SiGe layer having a defect, the defect is also generated in the Si layer. If this Si layer is transferred to another substrate, and a device is produced in the transferred Si layer, the defect of the Si layer deteriorates the device performance.

In this method, since the layer containing Ge as a sacrificial layer, reduction of the Ge concentration leads to reduction of the etching rate. Therefore, a constant Ge concentration is necessary.

A tradeoff relationship is made between obtaining an excellent Si layer and using a layer having a certain Ge concentration or higher as the sacrificial layer.

To obtain the transfer silicon layer with few defects, it is desirable that the sacrificial layer interposed between the Si substrate and the transfer silicon layer have a lattice gap substantially parallel to the Si substrate surface maintained substantially equal to that of the Si substrate. As a result, the sacrificial layer becomes a layer having a strain. Meanwhile, it is desirable that the Si layer of the surface doesn't have a strain state.

Here, the lattice constants of carbon (c), silicon (Si), and germanium (Ge) are as follows.

C: 3.567 angstrom
Si: 5.431 angstrom
Ge: 5.658 angstrom

The inventor found that strain is not easily generated in the silicon layer grown on the sacrificial layer, and it is possible to obtain a silicon layer transfer substrate having a transfer silicon layer having a reduced number of defects if the thickness of the compound layer of the sacrificial layer is equal to or smaller than the critical film thickness.

The silicon layer transfer substrate according to the exemplary embodiment includes: a silicon substrate of a first substrate; a sacrificial layer; and a transfer silicon layer transferred to a second substrate, wherein the sacrificial layer has a silicon compound layer containing a compound of silicon and at least one element selected from a group consisting of germanium and carbon, and is provided on the silicon substrate of the first substrate, the silicon compound layer having a thickness equal to or smaller than a critical film thickness, the transfer silicon layer transferred to the second substrate is provided on the sacrificial layer, and at least either the silicon substrate or the silicon layer has a groove or a hole connected to the sacrificial layer.

Silicon Layer Transfer Substrate

<First Exemplary Embodiment>

FIG. 1 schematically illustrates a layer configuration of the silicon layer transfer substrate according to a first exemplary embodiment. In the silicon layer transfer substrate 10 according to the exemplary embodiment, a silicon substrate 12 as a first substrate and a silicon compound layer (SiGe layer 14) containing a compound of silicon and germanium as a sacrificial layer on the silicon substrate 12 are provided. The thickness of the SiGe layer is equal to or smaller than the critical film thickness. A transfer silicon layer 16 is provided on the SiGe layer 14.

Although the etchant penetration opening for etching a part of the sacrificial layer according to the exemplary embodiment is provided in at least either the silicon substrate 12 or the silicon layer 16 and has a groove and a hole connected to the sacrificial layer, such etchant penetration openings are omitted in FIG. 1. The etchant penetration openings will be omitted also in FIGS. 3 to 10 described later.

The critical film thickness according to an exemplary embodiment means a film thickness at which a strain is generated within the crystal, and the lattice strain is relaxed, and also means an upper limit of the film thickness to obtain an epitaxially grown layer with lattice-matched excellent crystals. In addition, the critical film thickness according to the exemplary embodiment is based on a theoretical value of Matthews-Blakeslee.

Figure 2:
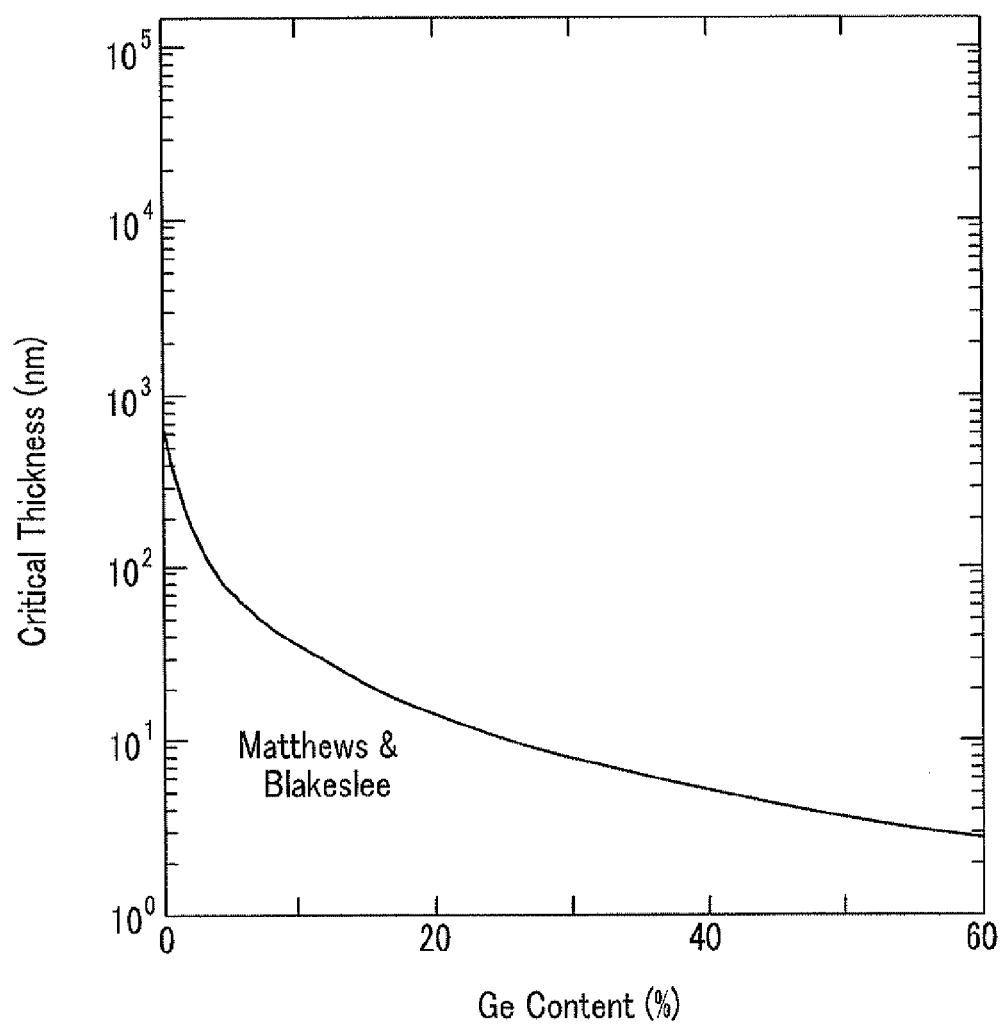
FIG. 2 is a diagram illustrating the relationship between a composition ratio of germanium and a critical film thickness.

FIG. 2 illustrates the relationship between the Ge concentration (composition ratio) and the critical film thickness in the SiGe layer. For example, if the composition ratio of Ge in the SiGe layer is 20%, and the thickness is approximately set to 10 nm, the thickness is equal to or less than the critical film thickness. Therefore, strain is not easily generated, and the Si layer with few defects is formed even when the Si layer is epitaxially grown on the SiGe layer. Meanwhile, if the thickness of the SiGe layer is set to 30 nm, it exceeds the critical film thickness. Therefore, the strain is generated when the Si layer is epitaxially grown, so as to form the Si layer with a lot of defects.

Meanwhile, when the SiGe layer is used as the sacrificial layer, and the Si layer is transferred to another substrate, it is advantageous to increase the film thickness considering the relationship of the etching rate in order to remove a part of the sacrificial layer through the etching. In this regard, for example, in a case where a $Si_{0.99}Ge_{0.01}$ layer is formed with a Ge composition ratio of 1%, even a film thickness of 100 nm is equal to or smaller than the critical film thickness. In the surface Si layer epitaxially grown thereon, occurrence of a threading dislocation is suppressed. Therefore, it is possible to obtain a silicon layer transfer substrate having a transfer Si layer with few defects.

<Second Exemplary Embodiment>

Figure 3:
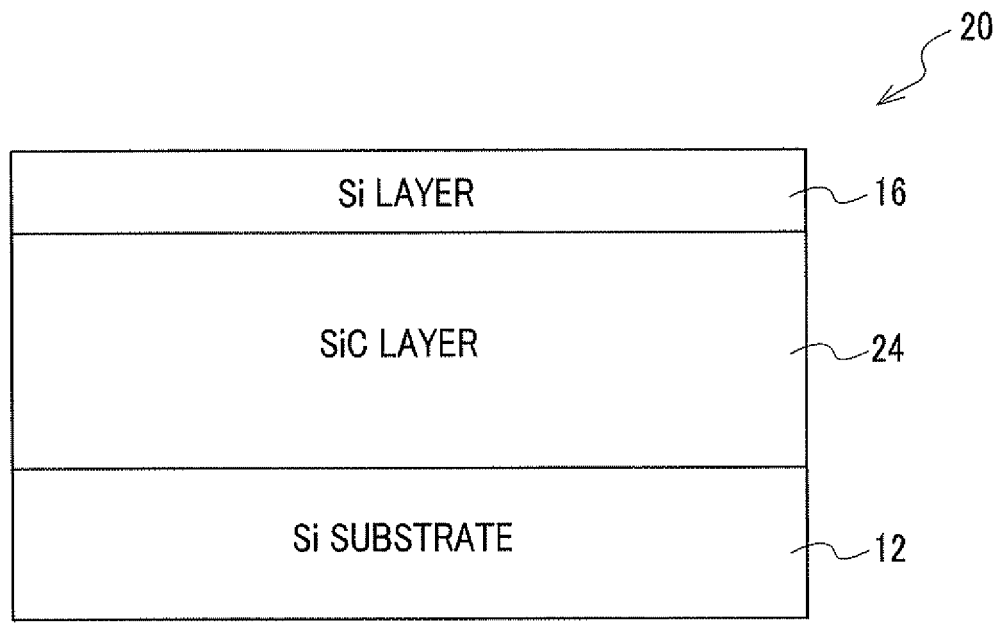
FIG. 3 is a schematic diagram illustrating an example of a layer configuration of a silicon layer transfer substrate according to an exemplary embodiment.

FIG. 3 schematically illustrates a layer configuration of the silicon layer transfer substrate according to the second exemplary embodiment. In the silicon layer transfer substrate 20 according to the exemplary embodiment, as a sacrificial layer, a silicon compound layer (SiC layer 24) containing a compound of silicon and carbon and having a thickness equal to or smaller than the critical film thickness is provided, and a transfer silicon layer is provided on the SiC layer 24.

Similarly, according to the present exemplary embodiment, since the thickness of the SIC layer 24 is equal to or smaller than the critical film thickness, it is possible to obtain the silicon layer transfer substrate having the transfer Si layer 16 with few defects. As mentioned above, as the composition ratio of C in the SiC layer 24 is reduced, the critical film thickness of the SiC layer 24 increases. Therefore, it is possible to obtain the SiC layer having a thickness (for example, about 100 nm) advantageously used in the etching of the post-processing.

<Third Exemplary Embodiment>

Figure 4:
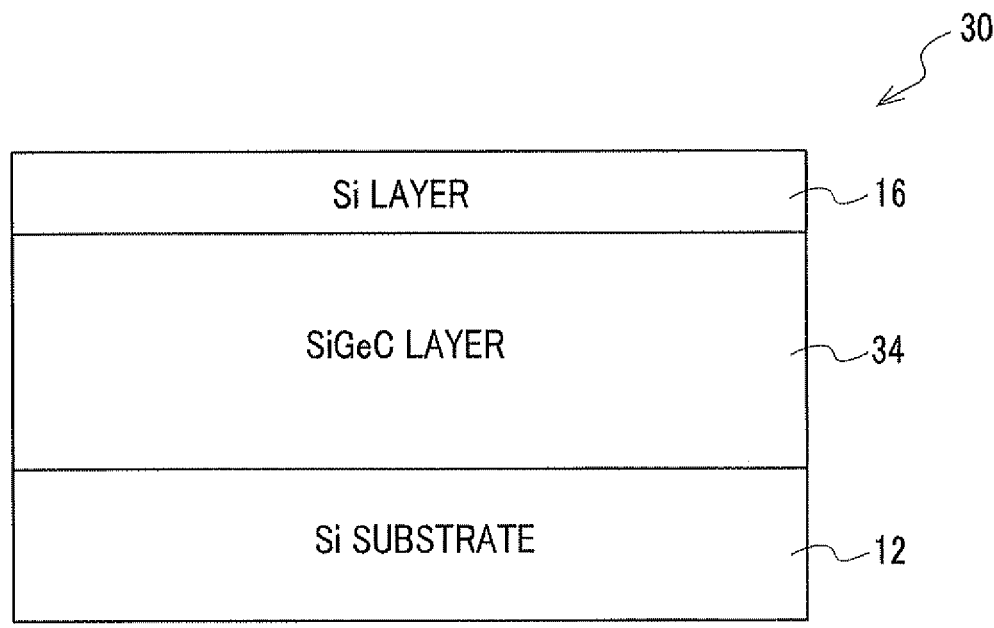
FIG. 4 is a schematic diagram illustrating an example of a layer configuration of a silicon layer transfer substrate according to an exemplary embodiment.

FIG. 4 schematically illustrates a layer configuration of the silicon layer transfer substrate according to the third exemplary embodiment. In the silicon layer transfer substrate 30 according to the present exemplary embodiment, as the sacrificial layer, a silicon compound layer (SiGeC layer 34) containing a compound of silicon, germanium, and carbon is provided, and a transfer silicon layer 16 is provided on the SiGeC layer.

Similarly, in the present exemplary embodiment, since the thickness of the SiGeC layer 34 is equal to or smaller than the critical film thickness. Therefore, a threading dislocation is not easily generated in the surface Si layer 16, and it is possible to obtain the silicon layer transfer substrate 30 having the transfer silicon layer 16 with few defects.

<Fourth Exemplary Embodiment>

Figure 5:
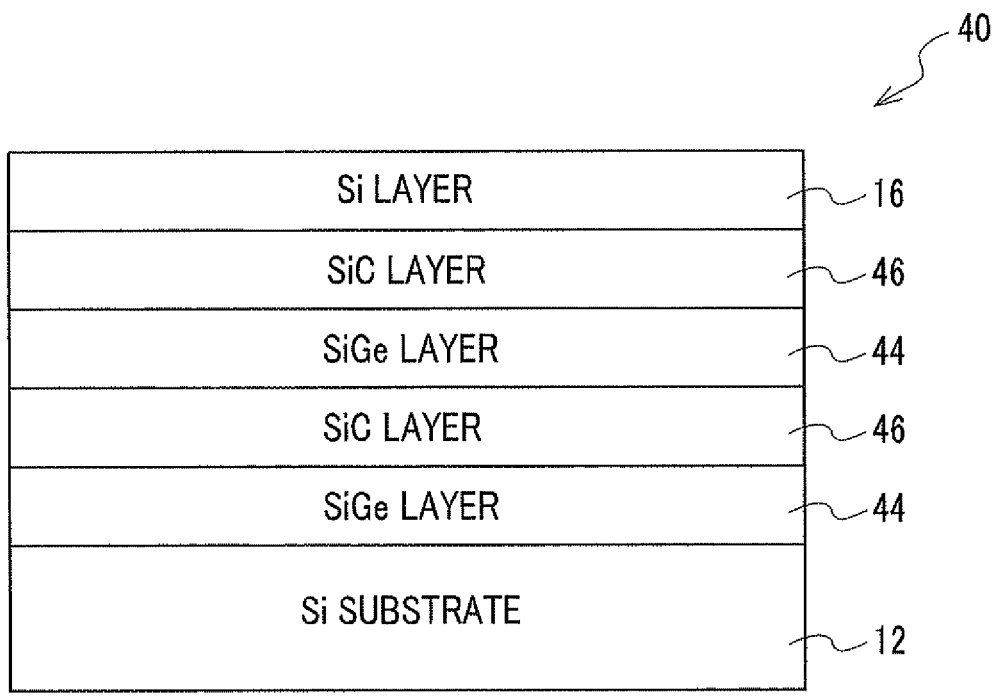
FIG. 5 is a schematic diagram illustrating an example of a layer configuration of a silicon layer transfer substrate according to an exemplary embodiment.

FIG. 5 schematically illustrates a layer configuration of a silicon layer transfer substrate according to a fourth exemplary embodiment. In the silicon layer transfer substrate according to the present exemplary embodiment, the sacrificial layer has a multi-layered structure in which a first silicon compound layer (SiGe layer 44) containing a compound of silicon and germanium and a second silicon compound layer (SiC layer 46) containing a compound of silicon and carbon are alternately laminated, and the transfer silicon layer 16 is provided on the sacrificial layer.

In the present exemplary embodiment, all of the layers (SiGe layer 44 and SiC layer 46) included in the sacrificial layer have thicknesses equal to or smaller than the critical film thickness. Therefore, the threading dislocation is not easily generated in the surface Si layer 16, and it is possible to obtain the silicon layer transfer substrate 40 having the transfer silicon layer with few defects.

Although the bottom layer of the sacrificial layer is the SiGe layer 44, and the top layer of the sacrificial layer is the SiC layer 46 in FIG. 5, the invention is not limited to such a multi-layered structure. For example, like the silicon layer transfer substrate 50 illustrated in FIG. 6, the bottom layer may be the SiC layer 46, and the top layer may be the SiGe layer 44.

If the sacrificial layer has such a multi-layered structure, it is easy to increase the entire thickness of the sacrificial layer. If the groove or the hole connected to the sacrificial layer is formed as the etchant penetration opening, the etchant easily reaches the sacrificial layer.

The number of the layers in the sacrificial layer is not limited in particular. However, the number of the layers in the sacrificial layer is preferably from 2 to 20 (or from 2 to about 20), and more preferably from 4 to 8, from the viewpoint of increasing the thickness and suppressing reduction in productivity.

The entire thickness of the sacrificial layer is preferably from 50 nm to 3 μm (or from about 50 nm to about 3 μm), and more preferably from 200 nm to 1 μm, from the viewpoint of productivity, etching efficiency, and the like.

<Fifth Exemplary Embodiment>

Figure 7:
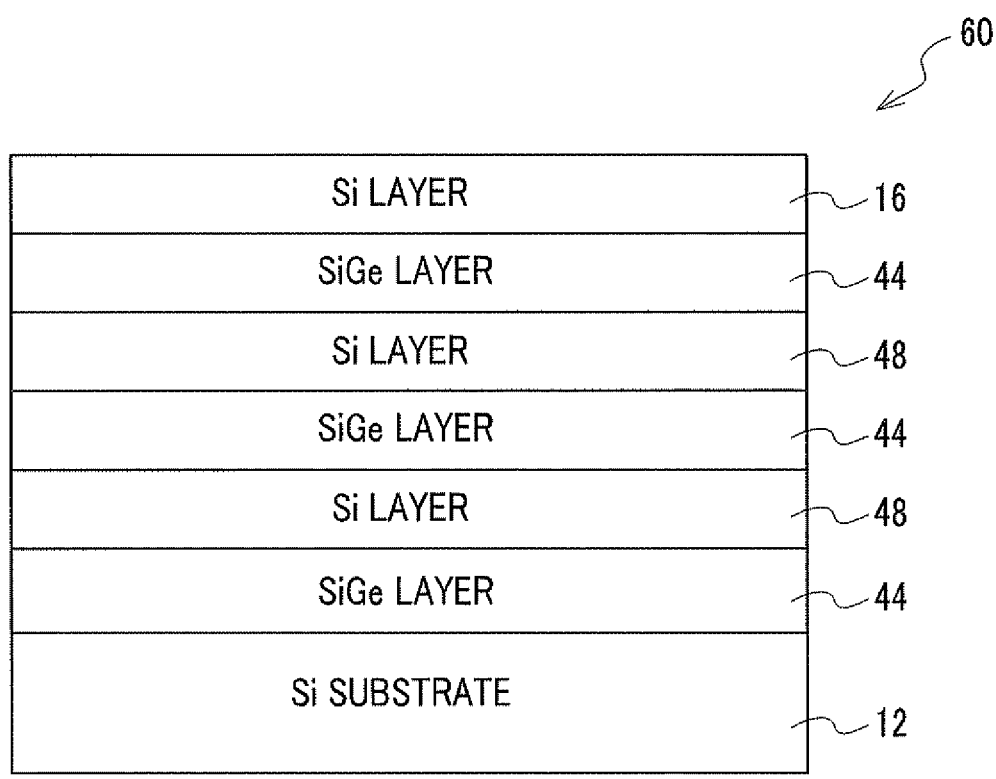
FIG. 7 is a schematic diagram illustrating an example of a layer configuration of a silicon layer transfer substrate according to an exemplary embodiment.

FIG. 7 schematically illustrates a layer configuration of a silicon layer transfer substrate according to a fifth exemplary embodiment. In the silicon layer transfer substrate according to the present exemplary embodiment, the sacrificial layer has a multi-layered structure in which a silicon compound layer (SiGe layer 44) containing a compound of silicon and germanium and a silicon layer (Si layer 48) different from the transfer silicon layer 16 are alternately laminated, and the SiGe layer 44 makes contact with the transfer silicon layer 16.

In the present exemplary embodiment, the thicknesses of all silicon compound layers (SiGe layer 44) of the sacrificial layer are equal to or smaller than the critical film thickness. Therefore, the threading dislocation is not easily generated in the surface Si layer 16, and it is possible to obtain the silicon layer transfer substrate having the transfer silicon layer with few defects.

In addition, the number of the multi-layers and the entire thickness of the sacrificial layer are similar to those of the fourth exemplary embodiment.

<Sixth Exemplary Embodiment>

Figure 8:
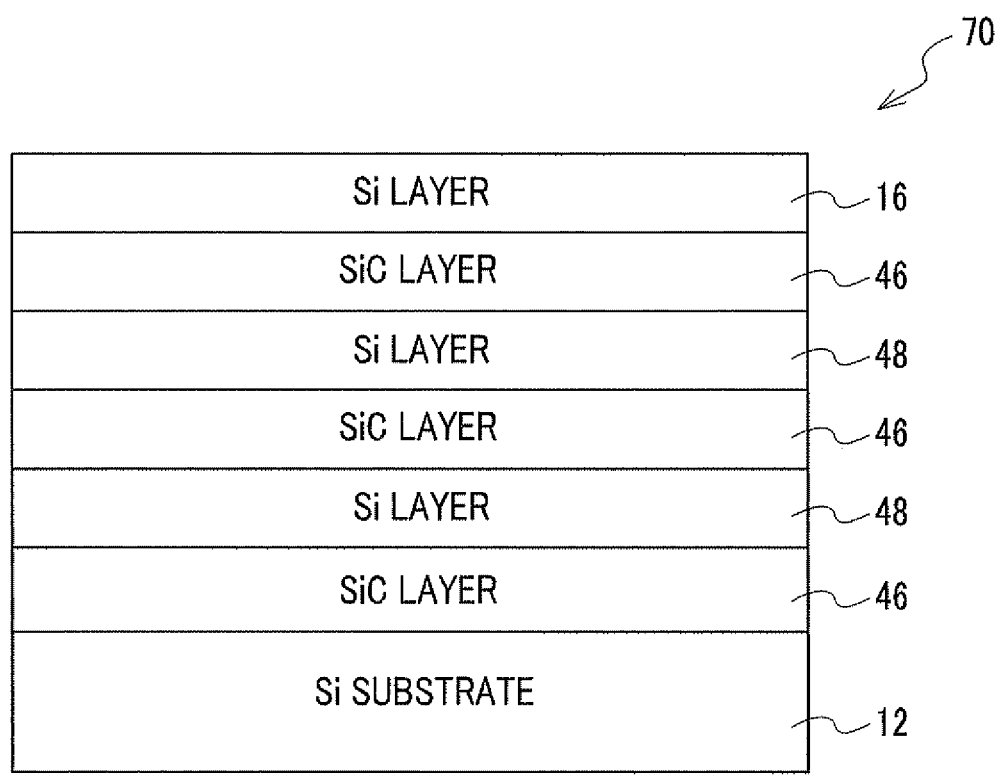
FIG. 8 is a schematic diagram illustrating an example of a layer configuration of a silicon layer transfer substrate according to an exemplary embodiment.

FIG. 8 schematically illustrates a layer configuration of a silicon layer transfer substrate according to a sixth exemplary embodiment. In the silicon layer transfer substrate according to the present exemplary embodiment, the sacrificial layer has a multi-layered structure in which a silicon compound layer (SiC layer 46) containing a compound of silicon and carbon and a silicon layer (Si layer 48) different from the transfer silicon layer 16 are alternately laminated, and the SiC layer 46 makes contact with the transfer silicon layer 16.

Similarly, in the exemplary embodiment, the thicknesses of all of the silicon compound layers (SiC layer 46) of the sacrificial layer are equal to or less than the critical film thickness. Therefore, the threading dislocation is not easily generated in the surface Si layer 16, and it is possible to obtain the silicon layer transfer substrate 70 having the transfer silicon layer with few defects.

In addition, the number of the multi-layers and the entire thickness of the sacrificial layer are similar to those of the fourth exemplary embodiment.

<Seventh Exemplary Embodiment>

Figure 9:
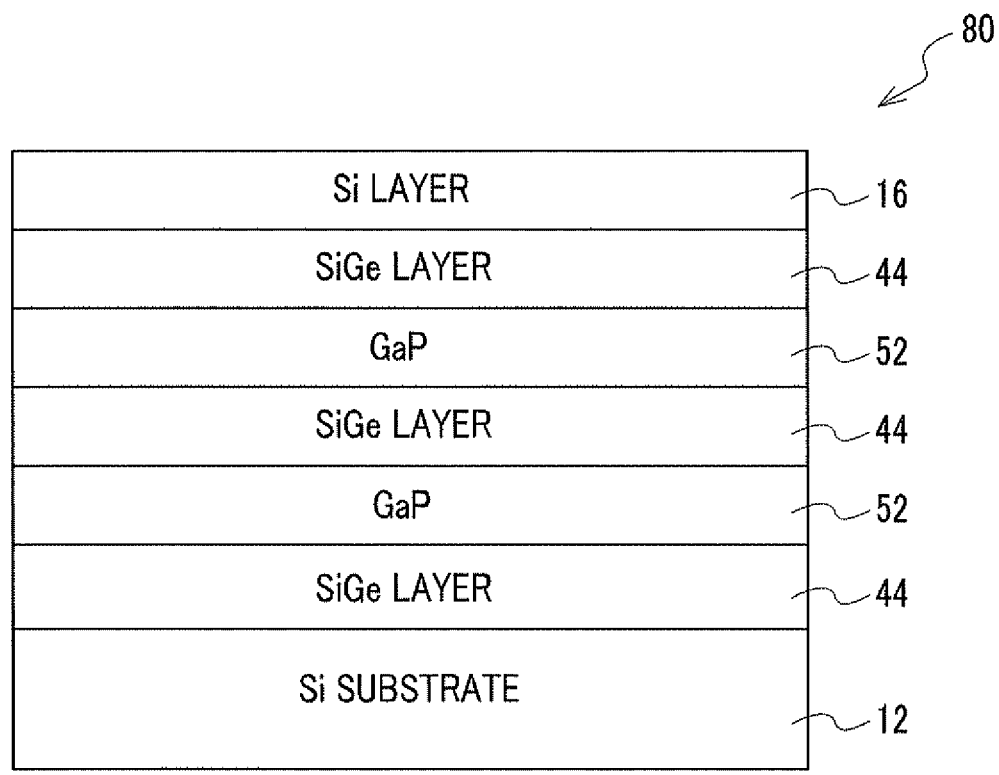
FIG. 9 is a schematic diagram illustrating an example of a layer configuration of a silicon layer transfer substrate according to an exemplary embodiment.

FIG. 9 schematically illustrates a layer configuration of a silicon layer transfer substrate according to a seventh exemplary embodiment. In the silicon layer transfer substrate according to the present exemplary embodiment, the sacrificial layer has a multi-layered structure in which a silicon compound layer (SiGe layer 44) containing a compound of silicon and germanium and a compound semiconductor layer (GaP layer 52) containing gallium (Ga) and phosphorus (P) are alternately laminated, and the SiGe layer 44 makes contact with the transfer silicon layer 16.

Similarly, in the present exemplary embodiment, the thicknesses of all of the SiGe layer 44 and the GaP layer 52 of the sacrificial layer are equal to or smaller than the critical film thickness. Therefore, the threading dislocation is not easily generated in the surface Si layer 16, and it is possible to obtain the silicon layer transfer substrate 80 having the transfer silicon layer with few defects.

In addition, the number of the multi-layers and the entire thickness of the sacrificial layer are similar to those of the fourth exemplary embodiment.

<Eighth Exemplary Embodiment>

Figure 10:
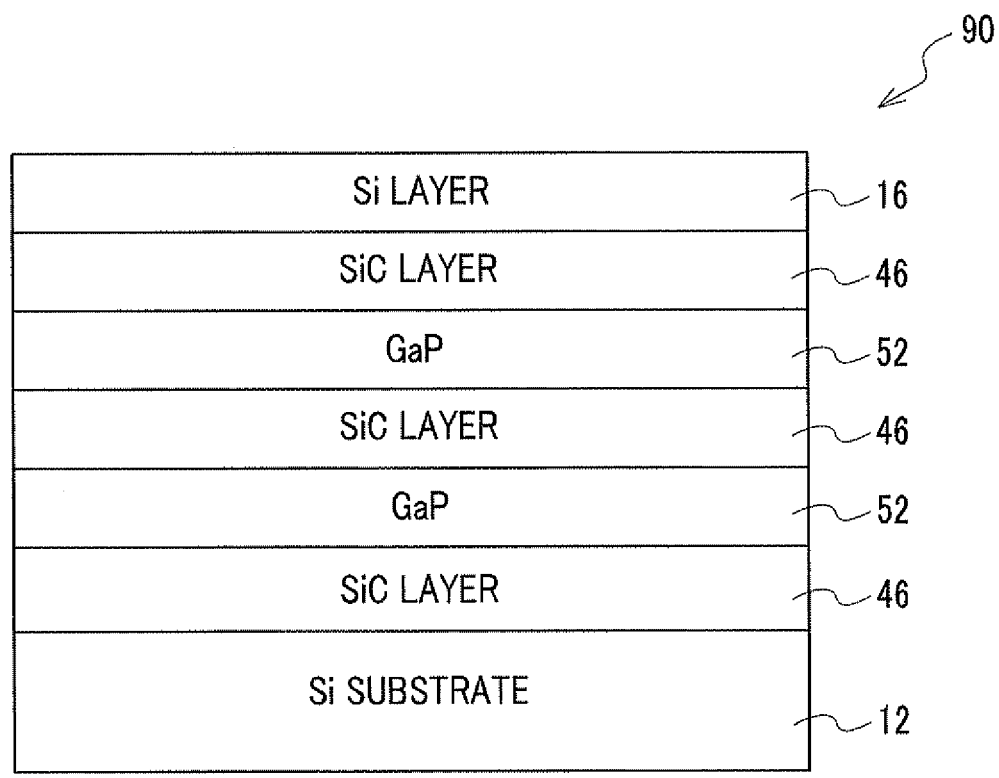
FIG. 10 is a schematic diagram illustrating an example of a layer configuration of a silicon layer transfer substrate according to an exemplary embodiment.

FIG. 10 schematically illustrates a layer configuration of a silicon layer transfer substrate according to an eighth exemplary embodiment. In the silicon layer transfer substrate 90 according to the exemplary embodiment, the sacrificial layer has a multi-layered structure in which a silicon compound layer (SiC layer 46) containing a compound of silicon and carbon and a compound semiconductor layer (GaP layer 52) of gallium (Ga) and phosphorus (P) are alternately laminated, and the SiC layer 46 makes contact with the transfer silicon layer 16.

Similarly, in the present exemplary embodiment, the thicknesses of all of the SiC layer 46 and the GaP layer 52 of the sacrificial layer are equal to or smaller than the critical film thickness. Therefore, the threading dislocation is not easily generated in the surface Si layer, and it is possible to obtain the silicon layer transfer substrate 90 having the transfer silicon Si layer with few defects.

In addition, the number of the multi-layers and the entire thickness of the sacrificial layer are similar to those of the fourth exemplary embodiment.

Although description has been made for a case where the compound semiconductor layer of the sacrificial layer has the GaP layer in the seventh and eighth exemplary embodiments, the compound semiconductor layer is not limited thereto. For example, GaAs, InAs, GaSb, InSb, InP, GaAsSb, AlGaAs, AlN, InN, SN, GaN, and the like may be formed.

—Method of Manufacturing Semiconductor Substrate—

Next, a method of manufacturing the semiconductor substrate using the silicon layer transfer substrate according to an exemplary embodiment will be described.

A method of manufacturing a semiconductor substrate according to an exemplary embodiment includes preparing the silicon layer transfer substrate according to the present exemplary embodiment, bonding a second substrate to the transfer silicon layer of the silicon layer transfer substrate to obtain a composite substrate, removing at least a part of the sacrificial layer through the groove or the hole by contacting the composite substrate with an etchant for etching the sacrificial layer, and separating the second substrate having the transfer silicon layer from the composite substrate obtained by removing at least a part of the sacrificial layer.

FIGS. 11A to 11C and 12A to 12B schematically illustrate processes of the method of manufacturing the semiconductor substrate using the silicon layer transfer substrate according to an exemplary embodiment.

<Process of Preparing Silicon Layer Transfer Substrate>

The silicon layer transfer substrate 100 is prepared according to the exemplary embodiments described above.

First, a single-crystal silicon substrate 12 is prepared and cleaned. Then, the sacrificial layer 104 is formed such that the compound layer of the sacrificial layer on the silicon substrate 12 has a thickness equal to or smaller than the critical film thickness. The sacrificial layer 104 may be formed through a CVD method, a MBE method, a sputtering method, a vacuum deposition method, and the like.

Figure 11A:
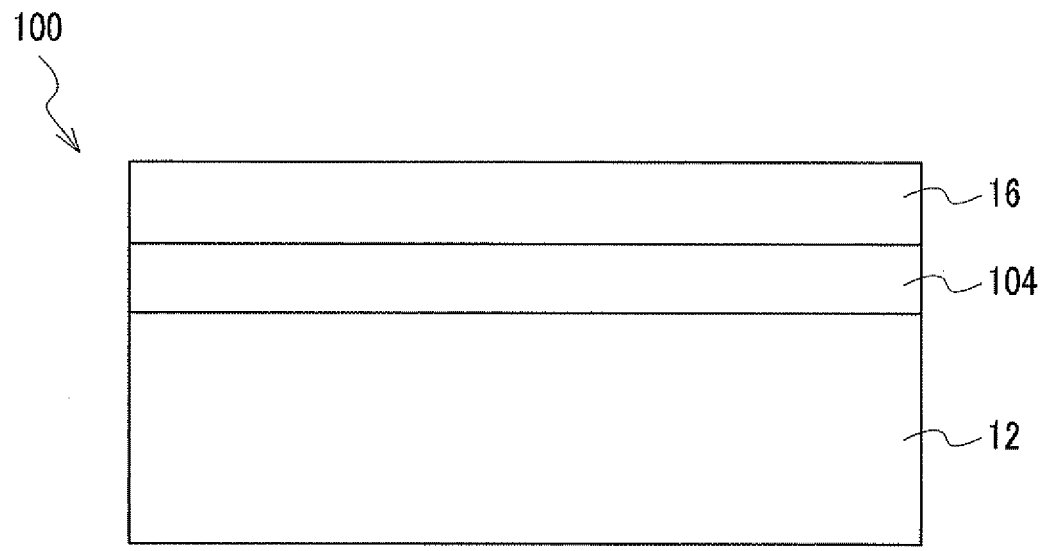
FIGS. 11A to 11C are schematic diagrams illustrating a preprocess regarding an example of a method of manufacturing a semiconductor substrate according to an exemplary embodiment.

Then, the transfer silicon layer 16 (single-crystal, poly-crystal, or amorphous) is formed on the sacrificial layer 104 (FIG. 11A). For example, the transfer silicon layer 16 is formed on the sacrificial layer 104 using an epitaxially growth method. For example, the thickness of the transfer silicon layer 16 may be determined depending on a usage after the transfer and is from 100 nm to 1 μm.

Figure 11B:
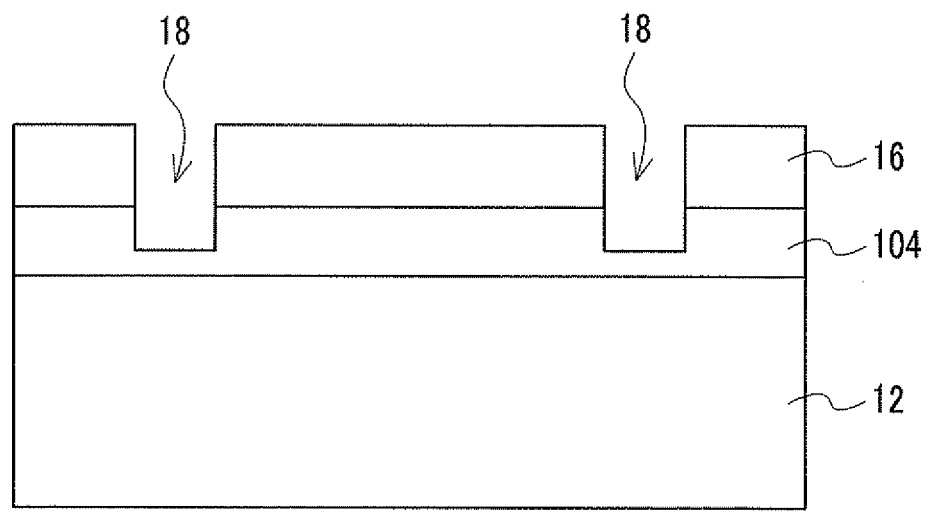

In the silicon layer transfer substrate 100, a groove or hole (etchant penetration opening 18), for penetrating the etchant, connected to the sacrificial layer 104 is provided (FIG. 11B).

The etchant penetration opening 18 may be provided in at least either the silicon substrate 12 or the silicon layer 16. The etchant penetration opening 18 is necessary to reach at least the sacrificial layer 104 in a depth direction. It may reach the silicon substrate 12 if the penetration opening 18 is provided from the side of the transfer silicon layer 16.

Figure 13A:
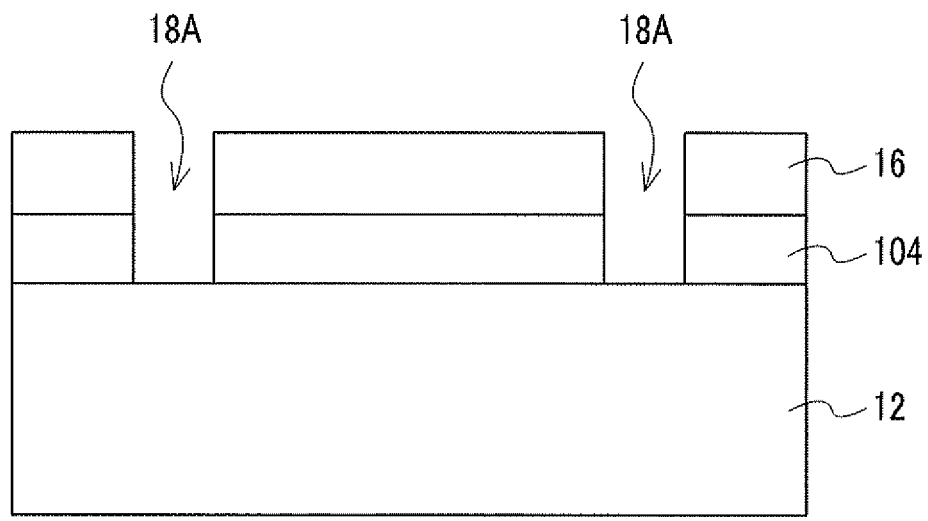
Figure 13B:
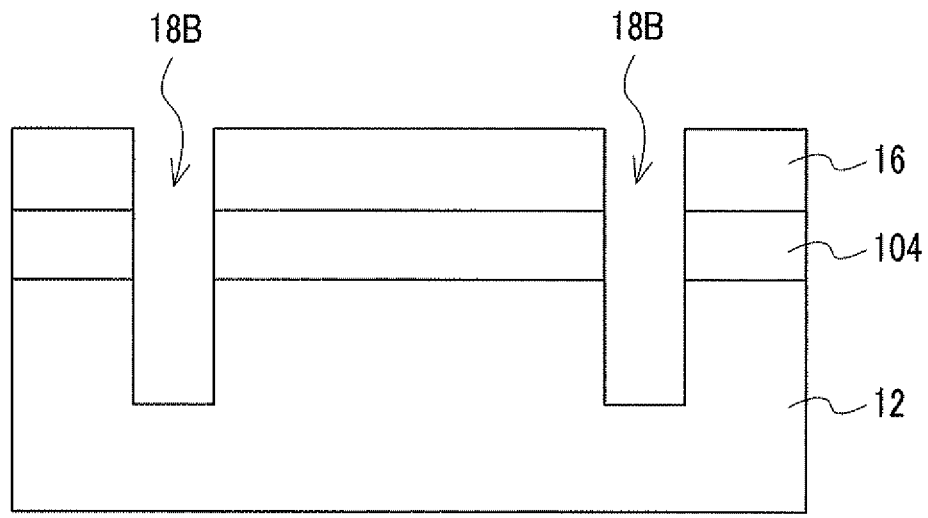

Specifically, an etchant penetration opening 18A may pass through the transfer silicon layer 16 and the sacrificial layer 104 and reach the surface of the silicon substrate 12 as shown in FIG. 13A. Alternatively, the etchant penetration opening 18B may pass through the transfer silicon layer 16 and the sacrificial layer 104 and reach a depth of a part of the silicon substrate 12 as shown in FIG. 13B. Alternatively, an etchant penetration opening 18C may pass through the transfer silicon layer 16 and reach a depth of a part of the sacrificial layer 104 as shown in FIG. 13C.

If the etchant penetration opening 18B reaches the middle of the silicon substrate 12 as shown in FIG. 13B, the etchant is appropriately supplied to the sacrificial layer 104 through the penetration opening 18B even when the thicknesses of the transfer silicon layer 16 and the sacrificial layer 104 are thin (for example, smaller than 1 μm).

Meanwhile, in the configuration in which the etchant penetration opening 18A reaches the surface of the silicon substrate 12 as shown in FIG. 13A, if a coating method of low coating precision is applied to bond the transfer silicon layer 16 of the silicon layer transfer substrate 100 and the second substrate 200 as a transfer destination of that silicon layer 16 to each other in the next bonding process, the adhesive may overflow the inner side of the etchant penetration opening 18A and reach the surface of the second substrate 12 of the transfer destination. In addition, the silicon substrate as the first substrate and the second substrate are bonded to each other so as to affect the process of removing and separating the sacrificial layer using the etchant afterward. However, if the etchant penetration opening 180 reaches the middle of the sacrificial layer 104 but does not reach the silicon substrate 12 as shown in FIG. 13C, it is possible to avoid the silicon substrate 12 and the second substrate 200 from being bonded even when the adhesive overflows the transfer silicon layer 18. For this reason, in the next process, the sacrificial layer is etched, and the second substrate transferred from the silicon layer 12 and the silicon substrate 12 are easily separated from each other.

Figure 13C:
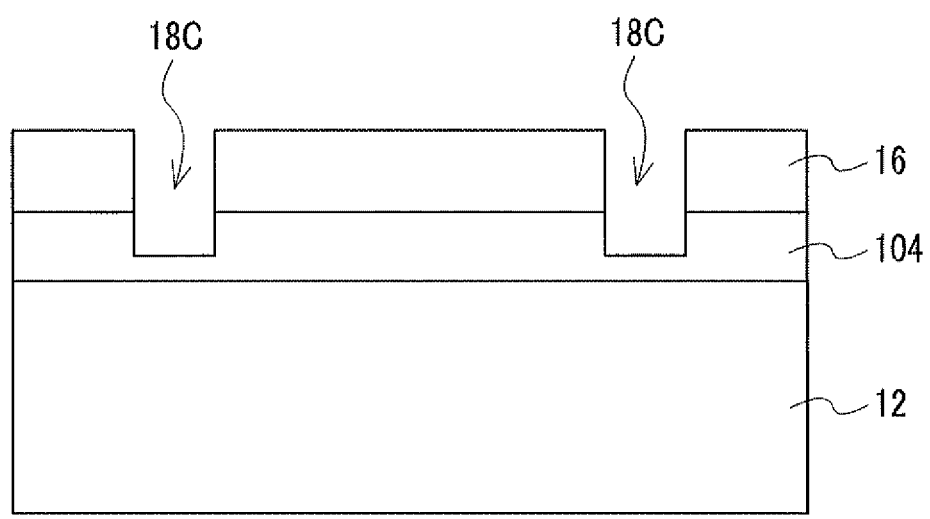

For this reason, in three configurations of the etchant penetration opening illustrated in FIGS. 13A to 13C, it is desirable that the etchant penetration opening 18B that reaches the middle of the silicon substrate 12 as shown in FIG. 13B or the etchant penetration opening 18C that reaches the middle of the sacrificial layer 104 as shown in FIG. 13C are provided.

Although description has been made for a case where the etchant penetration opening 18 of the configuration illustrated in FIG. 13C is formed in the method of manufacturing the semiconductor substrate illustrated in FIGS. 11 and 12, the etchant penetration openings 18A and 18B illustrated in FIG. 13A or 13B may be formed.

The gap between the penetration openings is related to the time necessary for a separation process. Although not specified in particular, as the gap is narrowed, the separation process time is reduced. A method of forming the etchant penetration opening 18 includes wet etching using nitric hydrofluoric, dry etching using a gas of Ar, $O_2$, $SF_6$, and the like.

Here, a device such as an electric circuit may be produced in the transfer silicon layer 16. In the device manufacture, a silicon process such as a photolithography method is typically used. The electric circuit may include a transistor, a capacitor, a resistor, a diode, or a combination thereof.

The formation of the etchant penetration opening 18 may be combined with a process of manufacturing the electric circuit. Since the melting of Ge is 937° C., it is preferable that the process temperature be lower than 937° C.

<Bonding Process>

Figure 11C:
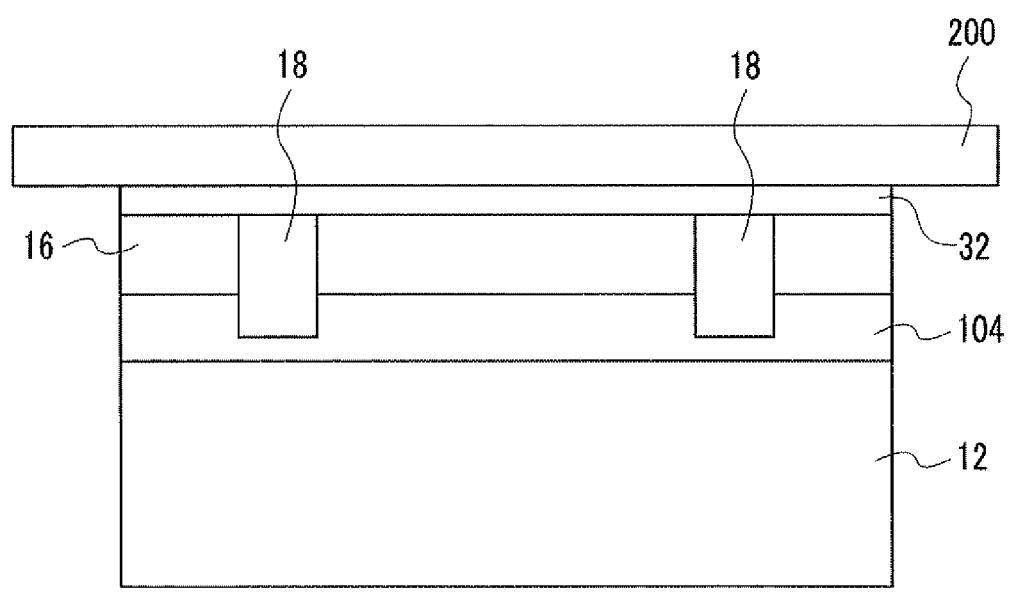

The composite substrate is obtained by bonding the second substrate 200 to the transfer silicon layer 16 of the silicon layer transfer substrate 100 (FIG. 11C).

The second substrate 200 may be selected depending on the usage of the semiconductor substrate after transferring the silicon layer. For example, a resin substrate such as PET, PEN, and polyimide film, a glass substrate, a silicon substrate, a substrate having metal film, wire, and the like may be used. The bonding may be made by using an adhesive such as aqueous, non-aqueous, thermosetting, and UV-curable adhesives, by using a double-sided bonding sheet 32, or by using no adhesive 32.

<Process of Removing Sacrificial Layer>

Figure 12A:
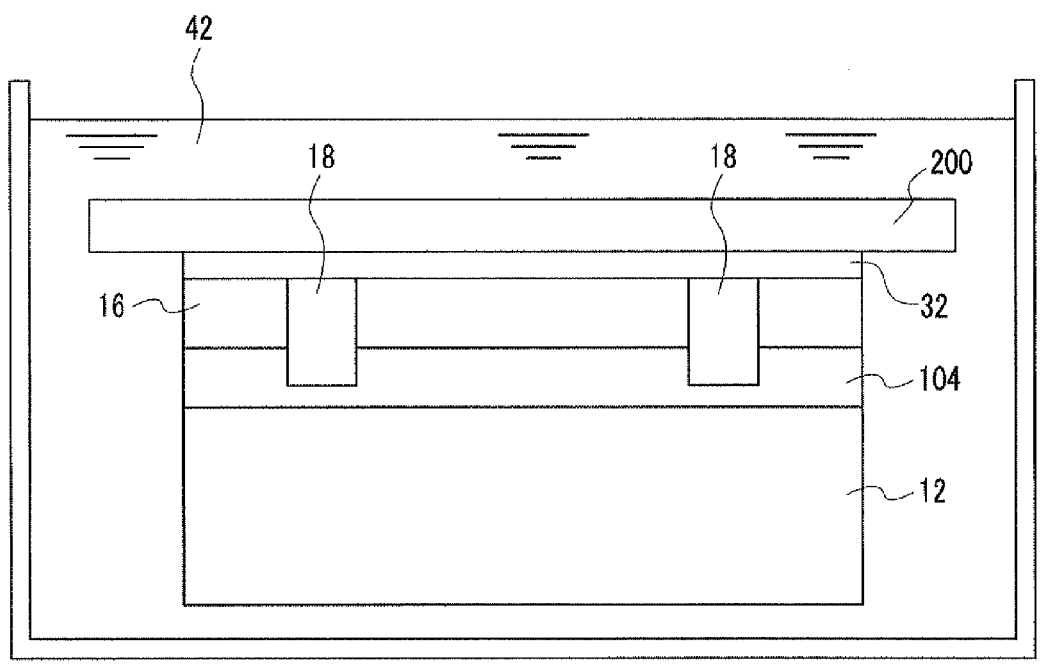
FIGS. 12A and 12B are schematic diagrams illustrating a post-process regarding an example of a method of manufacturing a semiconductor substrate according to an exemplary embodiment.

After the bonding process, the etchant for etching the sacrificial layer makes contact with the composite substrate, and at least apart of the sacrificial layer is removed through the groove or hole (FIG. 12A).

The etchant from the etchant penetration opening 18 reaches the sacrificial layer, and the etchant is used to selectively remove Ge or C of the sacrificial layer. For example, a part of the sacrificial layer 104 is removed by dipping the composite substrate in an oxidizing solution such as hydrogen peroxide water or water.

The etchant 42 may have a heated state in order to facilitate etching of the sacrificial layer 104. In addition, it is not necessary to dip the sacrificial layer 104 in a solution until the sacrificial layer 104 is perfectly etched and separated. For example, a part of the sacrificial layer 104 may be removed, for example, until the second substrate 200 obtained by bonding the transfer silicon layer 16 is cleaved in a substrate plane direction and separated from the composite substrate.

<Separation Process>

The second substrate 200 obtained by transferring the transfer silicon layer 16 is separated from the composite substrate obtained by removing at least a part of the sacrificial layer 104.

Figure 12B:
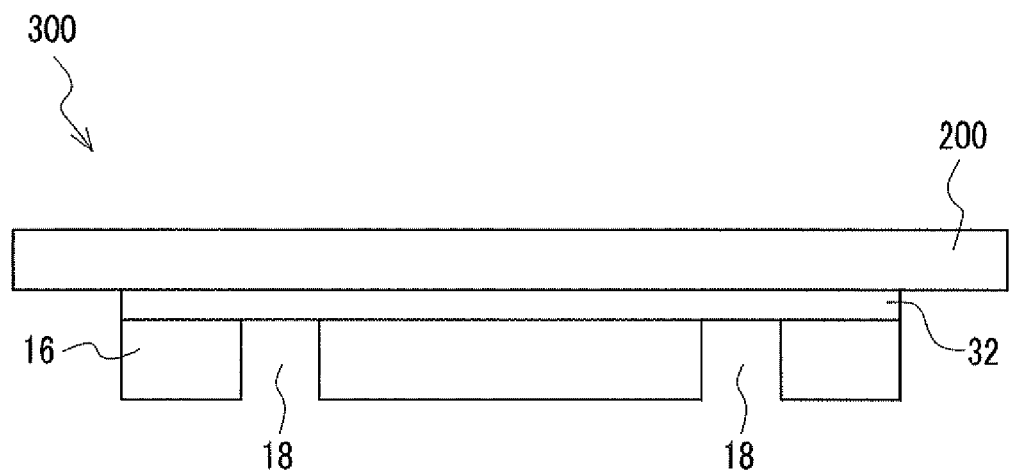

For example, a bonding substrate is cleaved in the substrate plane direction, and the second substrate 200 where the transfer silicon layer 16 is bonded is removed from the composite substrate. As a result, it is possible to obtain the semiconductor substrate 300 having the silicon layer 16 with few defects on the second substrate 200 (FIG. 12B).

In addition, after the silicon layer 16 is transferred on the second substrate 200, a wire, formation of a protective layer, and the like may be added by processing the silicon layer 16. In addition, the transferred silicon layer 16 may be further transferred to a third substrate.

EXAMPLES

The invention will be described with reference to the following examples. The invention is not limited by such examples.

Example 1

The silicon layer transfer substrate having a layer configuration of FIG. 1 is produced.

A SiGe layer (Si:Ge=99:1, thickness: 1 µm) is formed as the sacrificial layer on the single-crystal silicon substrate using a molecular beam epitaxial method (MBE method).

Then, the transfer silicon layer (thickness: 500 nm) is epitaxially grown on the SiGe layer.

Then, a resist mask is formed in the transfer silicon layer side using a photolithography method (size of resist mask: 100 µm×100 µm). The transfer silicon layer is removed using fluoronitric acid. This groove becomes the etchant penetration opening of the sacrificial layer.

Then, a composite substrate is made by heating/bonding the glass substrate having a bonding layer (KYOCERA Chemical Co., product name: CT4200H) having a thickness of 1 µm at a temperature of 150° C. in the transfer silicon layer side through the bonding layer.

This composite substrate is dipped in an etching solution (concentrate: 20%) containing hydrogen peroxide solution for 6 hours.

Then, a semiconductor substrate having the silicon layer on a glass substrate is obtained by cleaving the composite substrate in a horizontal direction.

Example 2

The silicon layer transfer substrate having a layer configuration of FIG. 3 is produced using a method similar to Example 1.

In Example 2, a silicon layer transfer substrate is produced in the same manner as Example 1, except that the sacrificial layer described in Example 1 is changed to a $Si_{0.99}C_{0.01}$ layer (thickness: 100 nm).

Example 3

The silicon layer transfer substrate having a layer configuration of FIG. 4 is produced using a method similar to Example 1.

In Example 3, a silicon layer transfer substrate is produced in the same manner as Example 1, except that the sacrificial layer described in Example 1 is changed to a SiGeC layer (Si:Ge:C=70:27:3, thickness: 1 µm).

Example 4

Figure 6:
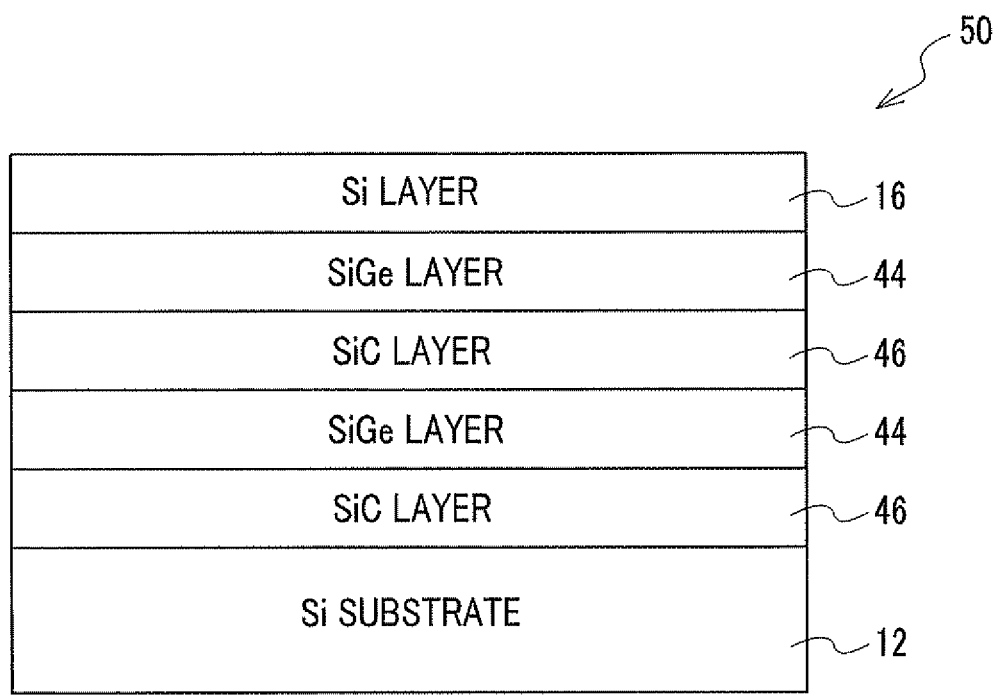
FIG. 6 is a schematic diagram illustrating an example of a layer configuration of a silicon layer transfer substrate according to an exemplary embodiment.

The silicon layer transfer substrate having a layer configuration of FIG. 6 is produced using a method similar to Example 1.

In Example 4, a silicon layer transfer substrate is produced in the same manner as Example 1, except that a SiC layer (Si:C=70:3, thickness: 5 nm) and a SiGe layer (Si:Ge=70:27, thickness: 5 nm) are formed as the sacrificial layer, the SiC layer and the SiGe layer are laminated in this order, and this procedure is repeated 10 times.

Example 5

The silicon layer transfer substrate having a layer configuration illustrated of FIG. 7 is produced using a method similar to Example 1.

In Example 5, a silicon layer transfer substrate is produced in the same manner as Example 1, except that a SiGe layer (Si:Ge=90:10, thickness: 10 nm) and a Si layer (thickness: 30 nm) are formed as the sacrificial layer, the SiGe layer and the Si layer are laminated in this order, and this procedure is repeated 10 times.

Example 6

The silicon layer transfer substrate having a layer configuration illustrated in FIG. 9 is produced using a method similar to Example 1.

In Example 6, a silicon layer transfer substrate is produced in the same manner as Example 1, except that a SiGe layer (Si:Ge=90:10, thickness: 10 nm) and a GaP layer (thickness: 30 nm) are formed as the sacrificial layer, the SiGe layer and the GaP layer are laminated in this order, this procedure is repeated 5 times, and a SiGe layer is further provided thereon.

Comparative Example 1

The silicon layer transfer substrate is produced using a method similar to Example 1 except that a SiGe layer (Si:Ge=90:10, thickness: 400 nm) is formed as the sacrificial layer, and the semiconductor substrate is produced using this silicon layer transfer substrate.

Comparative Example 2

The silicon layer transfer substrate is produced using a method similar to Example 1 except that a SiGe layer (Si:Ge=70:30, thickness: 100 nm) is formed as the sacrificial layer, and the semiconductor substrate is produced using this silicon layer transfer substrate.

The quality of the surface Si layer of the semiconductor substrate and the film thickness of the sacrificial layer produced through Examples and Comparative Examples are evaluated as follows.

—Thickness—

The film thickness of the sacrificial layer is evaluated by cross-sectional TEM observation.

The evaluation criterion indicates as follows.

G1: equal to or larger than 500 nm
G2: equal to or larger than 200 nm and smaller than 500 nm
G3: smaller than 200 nm —Quality—

The evaluation of crystal quality is evaluated by penetration dislocation concentration.

It is possible to detect a pit by selectively etching (Secco etching) the surface using the Secco liquid (compound liquid of $K_2Cr_2O_7$, hydrofluoric acid, and water).

The evaluation criterion is defined as follows.

G1: less than $10^1$ $cm^{-2}$
G2: equal to or larger than $10^1$ $cm^{-2}$ and smaller than $10^4$ $cm^{-2}$
G3: equal to or larger than $10^4$ $cm^{-2}$ and smaller than $10^6$ $cm^{-2}$
G4: equal to or larger than $10^6$ $cm^{-2}$ The result is represented in table 1.

TABLE 1

|  | Quality of Si Layer | Thickness of Sacrificial Layer |
|---|---|---|
| Example 1 | G3 | G1 |
| Example 2 | G3 | G3 |
| Example 3 | G2 | G1 |
| Example 4 | G1 | G3 |
| Example 5 | G1 | G2 |
| Example 6 | G2 | G2 |
| Comparative Example 1 | G4 | G2 |
| Comparative Example 1 | G4 | G3 |

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A silicon layer transfer substrate comprising:
   a first substrate that is a silicon substrate;
   a sacrificial layer provided on the first substrate;
   a transfer silicon layer provided on the sacrificial layer, the transfer silicon layer configured to be transferred to a second substrate; and
   a groove or a hole formed in the silicon layer transfer substrate that extends in a thickness direction through the transfer silicon layer and through only a portion of the sacrificial layer, but not extending to the first substrate,
      wherein the sacrificial layer has a silicon compound layer containing a compound of silicon and at least one element selected from the group consisting of germanium and carbon, the silicon compound layer having a thickness equal to or smaller than a critical film thickness.

2. The silicon layer transfer substrate according to claim 1, wherein the silicon compound layer contains a compound of silicon, germanium, and carbon.

3. The silicon layer transfer substrate according to claim 1, wherein
   the sacrificial layer has a plurality of silicon compound layers,
   the silicon compound layers contain a first silicon compound layer containing a compound of silicon and germanium and a second silicon compound layer containing a compound of silicon and carbon, and are alternately laminated as the silicon compound layers, and
   each of the silicon compound layers has a thickness equal to or smaller than a critical film thickness.

4. The silicon layer transfer substrate according to claim 1, wherein:
   the sacrificial layer has the silicon compound layer and a silicon layer that are alternately laminated, the silicon layer being different from the transfer silicon layer,
   the silicon compound layer contacts with the transfer silicon layer, and
   the silicon compound layer has a thickness equal to or smaller than a critical film thickness.

5. The silicon layer transfer substrate according to claim 1, wherein:
   the sacrificial layer has the silicon compound layer and a compound semiconductor layer that are alternatively laminated,
   the silicon compound layer contacts with the transfer silicon layer, and
   each of the silicon compound layer and the compound semiconductor layer has a thickness equal to or smaller than a critical film thickness.

6. The silicon layer transfer substrate according to claim 3, wherein the sacrificial layer has from 2 to about 20 layers.

7. The silicon layer transfer substrate according to claim 4, wherein the sacrificial layer has from 2 to about 20 layers.

8. The silicon layer transfer substrate according to claim 5, wherein the sacrificial layer has from 2 to about 20 layers.

9. The silicon layer transfer substrate according to claim 3, wherein an entire thickness of the sacrificial layer is from about 50 nm to about 3 μm.

10. The silicon layer transfer substrate according to claim 4, wherein an entire thickness of the sacrificial layer is from about 50 nm to about 3 μm.

11. The silicon layer transfer substrate according to claim 5, wherein an entire thickness of the sacrificial layer is from about 50 nm to about 3 μm.

12. The silicon layer transfer substrate according to claim 1, wherein the groove or the hole extends to the middle of the sacrificial layer in the thickness direction.

13. A method of manufacturing a semiconductor substrate, the method comprising:
   preparing a silicon layer transfer substrate that comprises:
      a first substrate that is a silicon substrate;
      a sacrificial layer provided on the first substrate;
      a transfer silicon layer provided on the sacrificial layer, the transfer silicon layer configured to be transferred to a second substrate; and
      a groove or a hole formed in the silicon layer transfer substrate that extends in a thickness direction through the transfer silicon layer and through only a portion of the sacrificial layer, but not extending to the first substrate,
         wherein the sacrificial layer has a silicon compound layer containing a compound of silicon and at least one element selected from the group consisting of germanium and carbon, the silicon compound layer having a thickness equal to or smaller than a critical film thickness;
   bonding the second substrate to the transfer silicon layer of the silicon layer transfer substrate to obtain a composite substrate;
   removing at least a part of the sacrificial layer through the groove or the hole by contacting the composite substrate with an etchant for etching the sacrificial layer; and
   separating the second substrate having the transfer silicon layer from the composite substrate obtained by removing at least a part of the sacrificial layer.

14. The method of manufacturing a semiconductor substrate according to claim 13, wherein the silicon compound layer contains a compound of silicon, germanium, and carbon.

15. The method of manufacturing a semiconductor substrate according to claim 13, wherein:
   the sacrificial layer has a plurality of silicon compound layers,
   the silicon compound layers contain a first silicon compound layer containing a compound of silicon and germanium and a second silicon compound layer containing a compound of silicon and carbon, and are alternately laminated as the silicon compound layers, and
   each of the silicon compound layers has a thickness equal to or smaller than a critical film thickness.

16. The method of manufacturing a semiconductor substrate according to claim 13, wherein:
   the sacrificial layer has the silicon compound layer and a silicon layer that are alternately laminated, the silicon layer being different from the transfer silicon layer,
   the silicon compound layer contacts with the transfer silicon layer, and the silicon compound layer has a thickness equal to or smaller than a critical film thickness.

17. The method of manufacturing a semiconductor substrate according to claim 13, wherein:
the sacrificial layer has the silicon compound layer and a compound semiconductor layer that are alternatively laminated,
the silicon compound layer contacts with the transfer silicon layer, and
each of the silicon compound layer and the compound semiconductor layer has a thickness equal to or smaller than a critical film thickness.

\* \* \* \* \*